United States Patent
Warfield

[11] Patent Number: 5,604,160
[45] Date of Patent: Feb. 18, 1997

[54] METHOD FOR PACKAGING SEMICONDUCTOR DEVICES

[75] Inventor: Timothy J. Warfield, Tempe, Ariz.

[73] Assignee: Motorola, Inc., Schaumburg, Ill.

[21] Appl. No.: 687,904

[22] Filed: Jul. 29, 1996

[51] Int. Cl.[6] .................................................. H01L 21/60
[52] U.S. Cl. ........................... 437/209; 437/211; 437/214; 437/217
[58] Field of Search .................................... 437/209, 211, 437/212, 214, 215, 216, 217, 218, 219, 220

[56] References Cited

U.S. PATENT DOCUMENTS

| | | | |
|---|---|---|---|
| 4,764,804 | 8/1988 | Sahara et al. | 437/215 |
| 4,907,065 | 3/1990 | Sahakian . | |
| 5,023,202 | 6/1991 | Long et al. | 437/217 |
| 5,173,451 | 12/1992 | Kinsman | 437/209 |
| 5,192,716 | 3/1993 | Jacobs | 437/209 |
| 5,219,794 | 6/1993 | Satoh et al. | 437/215 |
| 5,323,051 | 6/1994 | Adams et al. . | |
| 5,384,286 | 1/1995 | Hirai et al. | 437/217 |
| 5,476,818 | 12/1995 | Yanof et al. | 437/211 |
| 5,491,111 | 2/1996 | Tai | 437/211 |

*Primary Examiner*—Kevin Picardat
*Attorney, Agent, or Firm*—Bruce T. Neel

[57] ABSTRACT

A cap wafer (10) is used to package semiconductor devices on a device wafer (30). Successive etching processes form a plurality of partially etched cavities (27) extending from a front surface (11) of the cap wafer (10) into the cap wafer (10). The pattern of the partially etched cavities (27) is determined in accordance with the pattern of dies (32) on the device wafer (30). The cap wafer (10) is aligned with the device wafer (30) and bonded to the device wafer (30) using a glass frit as a bonding agent. After being bonded to the device wafer (30), the cap wafer (10) is thinned from the back surface (12) until the back surface (12) of the cap wafer (10) reaches the partially etched cavities (27). The device wafer (30) is then diced into distinct dies.

20 Claims, 4 Drawing Sheets

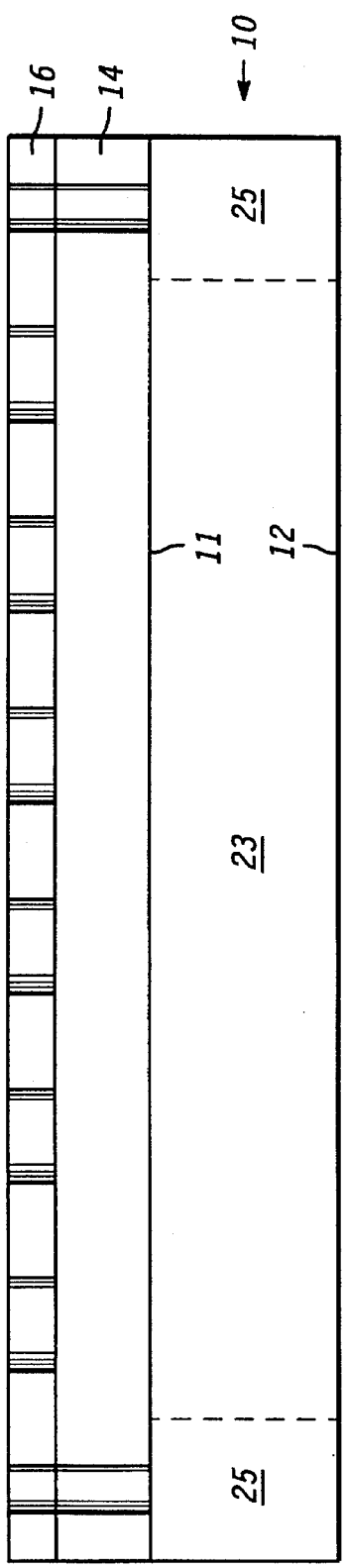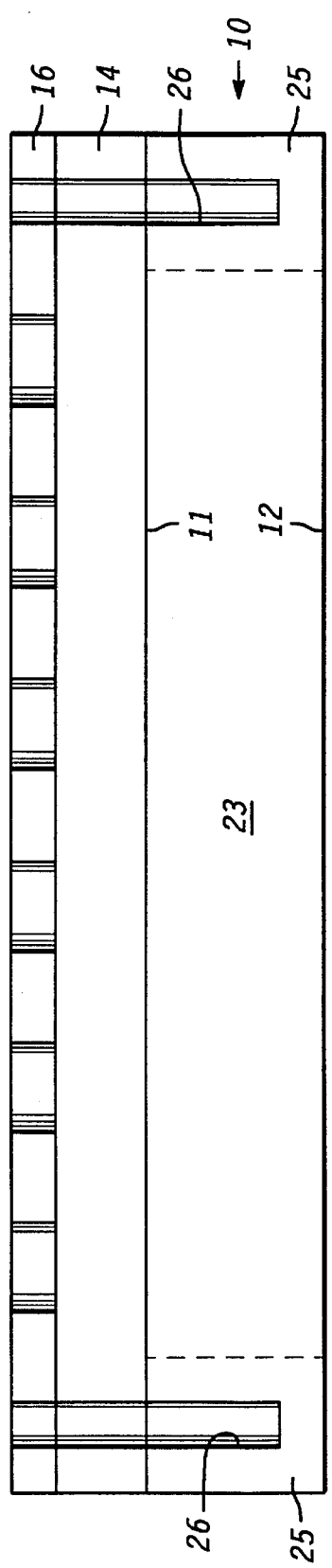

METHOD FOR PACKAGING SEMICONDUCTOR DEVICES

BACKGROUND OF THE INVENTION

The present invention relates, in general, to packaging semiconductor devices and, more particularly, to packaging semiconductor devices using cap wafers.

In applications such as sensing applications, semiconductor devices such as sensors formed on a device wafer are often hermetically sealed by bonding a cap wafer to the device wafer. The device wafer is then diced into distinct dies. Before bonding the cap wafer to the device wafer, a number of openings are formed in the cap wafer using an etching process. A glass frit is screen printed on the cap wafer. The cap wafer is then aligned to the device wafer so that the solid areas in the cap wafer overlie the semiconductor devices arranged in dies on the device wafer and the openings in the cap wafer overlie the bonding pads on the device wafer. The cap wafer and the device wafer assembly is placed in a furnace to heat the glass frit until the glass frit bonds the cap wafer and the device wafer together, and, this hermetically seals the dies on the device wafer.

As the die density on the device wafer increases, the density of the openings in the cap wafer must increase accordingly. Thus, the cap wafer becomes increasingly fragile, which increases the chance of the cap wafer being broken during the packaging process. An approach to increase the sturdiness of the cap wafer is to increase the thickness of the cap wafer. However, a thick cap wafer requires the openings in the cap wafer having a sloped boundary for accessing the bonding pads in a subsequent wire bonding process. The sloped boundary of the openings in a thick cap wafer consumes a large silicon area, thereby increasing the die size and decreasing the die density on the device wafer. Further, a thick cap wafer sometimes induces stress to the package when bonded to the device wafer and the stress may affect the operation of the semiconductor devices, such as sensors, in the package.

Accordingly, it would be advantageous to have a method for packaging semiconductor devices by bonding a cap wafer to a device wafer. It is desirable for the packaging method to maintain the sturdiness of the cap wafer as the die density on the device wafer increases. It is also desirable for the packaging method to maintain easy access to the wire bonding pads on the device wafer as the die size decreases. It would be of further advantage for the packaging method not to induce stress to the packaged devices.

BRIEF DESCRIPTION OF THE DRAWINGS

FIGS. 1–6 illustrate the steps of preparing a cap wafer in a packaging process in accordance with the present invention;

DETAILED DESCRIPTION OF THE DRAWINGS

Generally, the present invention provides a method for packaging semiconductor devices by bonding a cap wafer to a device wafer. A unique feature of the present invention is the forming of partially etched cavities on the cap wafer. Thus, the mechanical integrity or sturdiness of the cap wafer is maintained as the die density on the device wafer increases. A packaging process in accordance with the present invention is described hereinafter with reference to FIGS. 1–8. It should be noted that the same reference numbers are used in the figures to denote the same elements.

Figure 1:
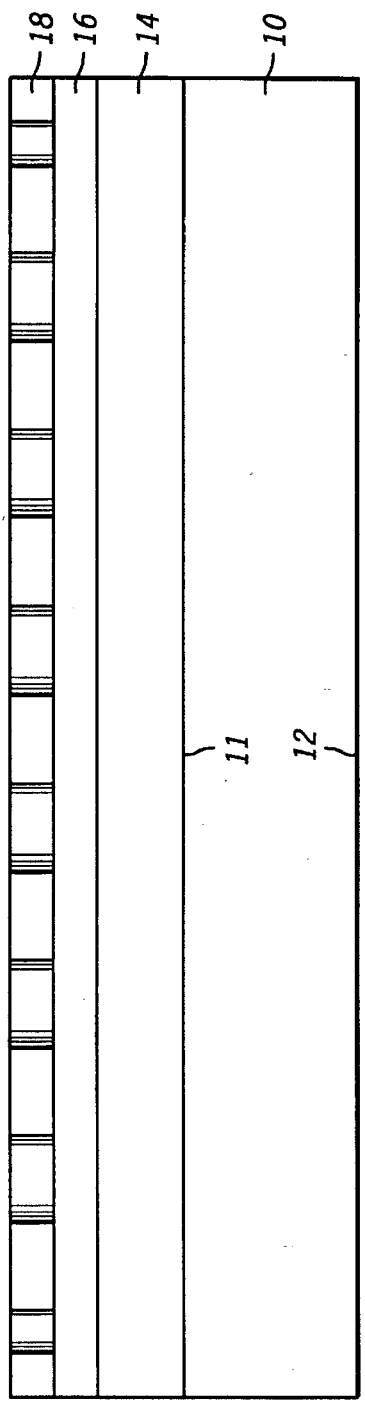

FIG. 1 is an enlarged cross-sectional view of a cap wafer 10 at an early step of a packaging process in accordance with the present invention. Cap wafer 10 has a front surface 11 and a back surface 12. By way of example, cap wafer 10 is a monocrystalline silicon wafer and has a thickness of approximately 600 micrometers ($\mu m$). A first dielectric layer 14 is formed on front surface 11 of cap wafer 10. By way of example, dielectric layer 14 is an oxide layer and has a thickness of approximately 675 nanometers (nm). A second dielectric layer 16 is formed on oxide layer 14. By way of example, dielectric layer 16 is a nitride layer and has a thickness of approximately 200 nm. Methods of forming an oxide layer on silicon and forming a nitride layer on oxide are well known in the art. A photoresist masking layer 18 is deposited on nitride layer 16. Masking layer 18 is patterned to expose nitride layer 16 overlying portions of cap wafer 10 in which alignment holes and partially etched cavities will be formed in subsequent steps of the packaging process.

Figure 2:
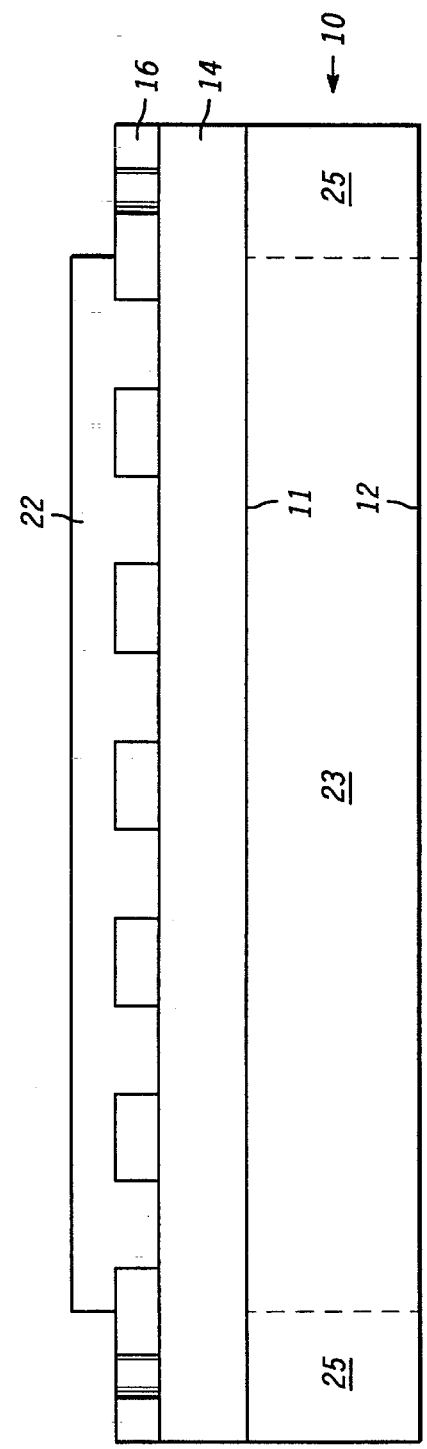

Referring now to FIG. 2, portions of nitride layer 16 that are unprotected by masking layer 18 of FIG. 1 are etched away in an etching process that preferably has a higher etch selectivity to oxide than to nitride. By way of example, nitride layer 16 is etched in a reactive ion etching process using a fluorine-containing gas as the etchant. The etching process forms openings in nitride layer 16 to expose oxide layer 14 which overlie portions of cap wafer 10 where alignment holes and partially etched cavities will be formed. After the etching process, masking layer 18 of FIG. 1 is stripped away from nitride layer 16 by immersing cap wafer 10 in a solvent such as acetone. A second photoresist masking layer 22 is formed on nitride layer 16 and on oxide layer 14 through the openings in nitride layer 16. Photoresist masking layer 22 is patterned to overlie a portion 23 and absent from portions 25 of cap wafer 10. Therefore, oxide layer 14 overlying portion 23 of cap wafer 10 is protected by photoresist masking layer 22 and portions of oxide layer 14 overlying portions 25 of cap wafer 10 are exposed through the openings in nitride layer 16. In subsequent steps of the packaging process, partially etched cavities and alignment holes will be formed through the openings in nitride layer 16 in portions 23 and 25, respectively.

FIG. 3 is an enlarged cross-sectional view of cap wafer 10 at a subsequent step of the packaging process. Portions of oxide layer 14 that are unprotected by masking layer 22 of FIG. 2 and nitride layer 16 are etched away in an etching process that preferably has a higher etch selectivity to nitride than to oxide. By way of example, oxide layer 14 is etched in a wet etching process using buffered hydrofluoric acid as the etchant. The etching process forms openings in oxide layer 14 to expose portions of cap wafer 10 where the alignment holes will be formed. After the etching process, masking layer 22 of FIG. 2 is stripped away from nitride layer 16 and oxide layer 14.

Referring now to FIG. 4, the silicon in portions 25 of cap wafer 10 and unprotected by oxide layer 14 is etched to form alignment cavities 26. Preferably, the etching process uses an etchant such as, for example, tetramethyl ammonium hydroxide, which is highly selective to nitride and oxide compared to silicon. Alignment cavities 26 extend from front surface 11 partially into cap wafer 10. It should be noted that alignment cavities 26 are not limited to extending only partially into cap wafer 10. In an alternative embodiment, the etching process etches the silicon unprotected by oxide layer 14 until alignment cavities 26 extend from front surface 11 through cap wafer 10 to back surface 12, thereby by forming alignment holes.

Figure 5:
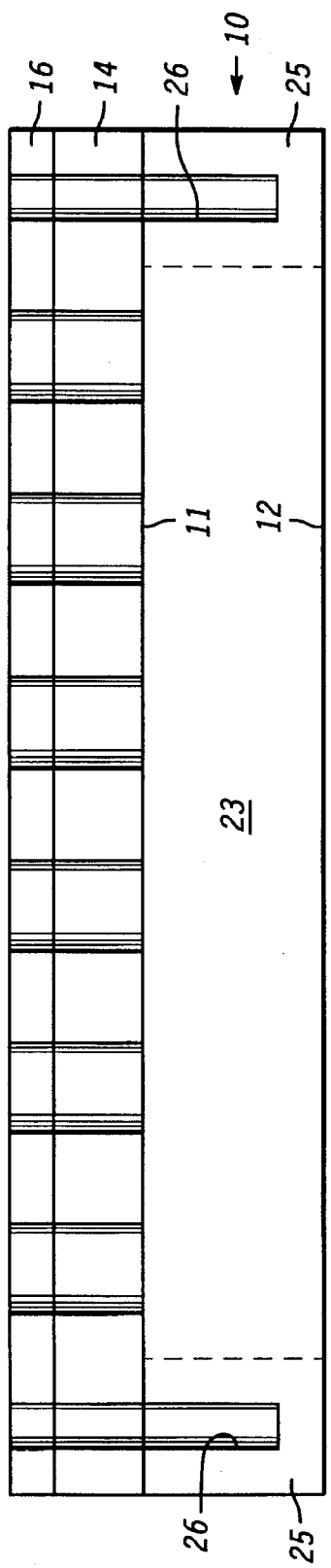

In FIG. 5, portions of oxide layer 14 that are unprotected by nitride layer 16 are etched away in an etching process that preferably has a higher etch selectivity to nitride than to oxide. By way of example, oxide layer 14 is etched in a wet etching process using buffered hydrofluoric acid as the etchant. The etching process forms openings in oxide layer 14 to expose portions of front surface 11 of cap wafer 10 where the partially etched cavities in portion 23 of cap wafer 10 will be formed later.

Figure 6:
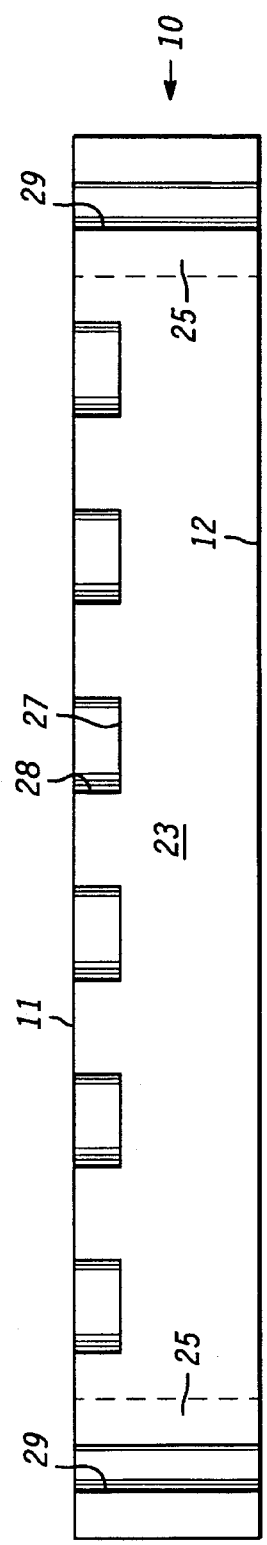

Referring now to FIG. 6, the silicon unprotected by oxide layer 14 of FIG. 5 is etched. Preferably, the etching process uses an etchant such as, for example, tetramethyl ammonium hydroxide, which is highly selective to nitride and oxide compared to silicon. In portion 23 of cap wafer 10, the etch process forms a plurality of recessed areas or partially etched cavities on front surface 11 of cap wafer 10. A recessed area or a partially etched cavity 27 is shown in FIG. 6 as a representative recessed area or partially etched cavity. The partially etched cavities extend from front surface 11 into cap wafer 10 to a depth of, for example, approximately 150 µm. Portions of front surface 11 in portion 23 and outside the recessed areas form a plurality of elevated areas or mesas. An elevated area or a mesa 28 is shown in FIG. 6 as a representative elevated area or mesa.

In portions 25, if alignment cavities 26 of FIGS. 4 and 5 formed in the etching process described with reference to FIG. 4 only extend partially into cap wafer 10, the etching process which forms the partially etched cavities in portion 23 of cap wafer 10 also etches the silicon in portions 25 of cap wafer 10. The etching process continues until alignment cavities 26 of FIGS. 4 and 5 extend from front surface 11 through cap wafer 10 to back surface 12o In other words, alignment cavities 26 of FIGS. 4 and 5 become alignment holes 29 as shown in FIG. 6. After the etching process, nitride layer 16 and oxide layer 14 of FIG. 5 are removed from front surface 11 of cap wafer 10 using an etchant such as, for example, buffered hydrofluoric acid.

Figure 7:
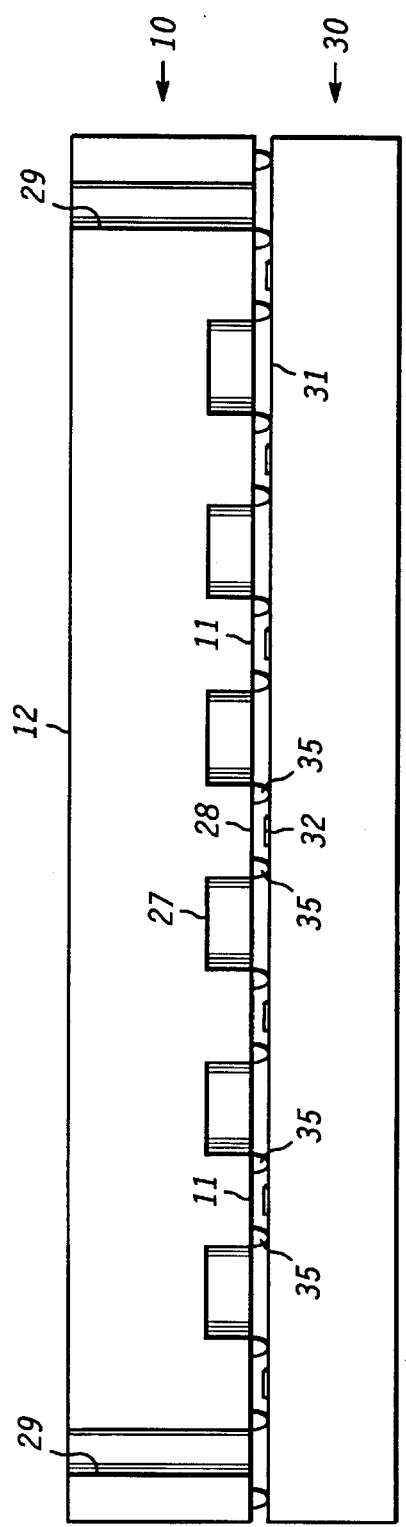
FIG. 7 illustrates the steps of bonding a cap wafer prepared using a method described with reference to FIGS. 1–6 to a device wafer in a packaging process in accordance with the present invention.

FIG. 7 is an enlarged cross-sectional view of cap wafer 10 and a device wafer 30, wherein cap wafer 10 is bonded to device wafer 30. Device wafer 30 support semiconductor devices such as, for example, sensor devices, fabricated on a major surface 31 of device wafer 30. Typically, semiconductor devices fabricated on device wafer 30 are arranged in a plurality of dies. A die 32 is shown in FIG. 7 as a representative die on device wafer 30. After the packaging process described herein, device wafer 30 will be diced into distinct dies. The dies are then attached to leadframes, wire bonded, and encapsulated using the packaging techniques which are well know to those skilled in the art.

When bonding cap wafer 10 to device wafer 30 as described hereinafter, each die on device wafer 30 is preferably under a corresponding mesa on cap wafer 10 as shown in FIG. 7. Thus, as the die density on device wafer 30 increases, the density of the mesas and, therefore, the density of the partially etched cavities or recessed areas on cap wafer 10 preferably increases accordingly. The silicon material between the recessed areas and back surface 12 is preferably thick enough to maintain the mechanical integrity and sturdiness of cap wafer 10 when the density of the recessed areas increases.

Prior to bonding cap wafer 10 to device wafer 30, a bonding agent such as, for example, a glass frit is deposited on front surface 11 of cap wafer 10 around the peripheries of the mesas of cap wafer 10, such as mesa 28. Typically, the glass frit is deposited on front surface 11 of cap wafer 10 using a standard screen printing technique. It should be understood that the glass frit is not limited to being screen printed on front surface 11 of cap wafer 10. For example, the glass frit may be deposited on cap wafer 10 using photolithography techniques.

Cap wafer 10 is positioned adjacent device wafer 30 with front surface 11 facing toward major surface 31 so that the glass frit deposited on cap wafer 10 contacts major surface 31 of device wafer 30. Alignment holes 29 are used to align cap wafer 10 to device wafer 30 so that a mesa, such as mesa 28, on cap wafer 10 overlies a corresponding die, such as die 32, on major surface 31 of device wafer 30. The glass frit forms bonding walls around the dies on device wafer 30. A bonding wall 35 around die 32 is shown in FIG. 7 as a representative bonding wall. Preferably, the glass frit bonding walls, such as bonding wall 35, completely surrounds the dies, such as die 32, on device wafer 30. The glass frit is heated to bond cap wafer 10 to device wafer 30, thereby hermetically sealing the semiconductor devices formed on device wafer 30.

In some applications such as, for example, acceleration sensing applications, the semiconductor devices operate in a vacuum or reduced pressure environment. To achieve the vacuum environment for the semiconductor devices, device wafer 30 and cap wafer 10 are placed in a vacuum chamber while heating the glass frit to bond cap wafer 10 to device wafer 30. In other words, the hermetic sealing process is performed in a reduced pressure environment.

It should be understood that other bonding processes and bonding agents may be used to bond cap wafer 10 to device wafer 30. For example, cap wafer 10 may be bonded to device wafer 30 via eutectic metal bonding, epoxy bonding, etc.

Next, the silicon between the recessed areas and back surface 12 of cap wafer 10 (FIG. 7) is removed. Therefore, partially etched cavities (FIG. 7) on cap wafer 10 extend all the way through cap wafer 10 from front surface 11. After removing the silicon between the recessed areas and back surface 12 of cap wafer 10 (FIG. 7), the remaining portions of cap wafer 10 cooperate with device wafer 30 to form device packages, thereby protecting the semiconductor devices on major surface 31 of device wafer 30.

Figure 8:
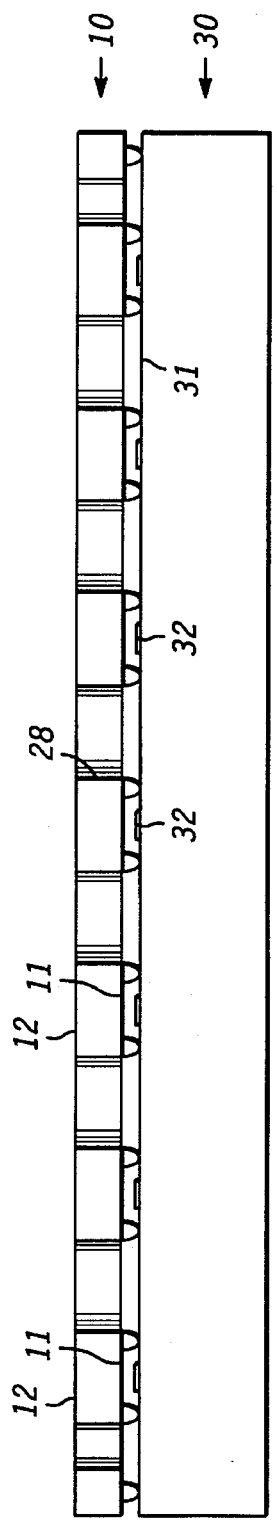
FIG. 8 is an enlarged cross-sectional view of semiconductor device packages on the device wafer before the device wafer is diced into distinct dies in a packaging process in accordance with the present invention.

In a preferred embodiment described with reference to FIG. 8, cap wafer 10 is thinned from back surface 12 by grinding. The grinding continues until the thickness of cap wafer 10 is equal to or less than the depth of the recessed areas or partially etched cavities extending from front surface 11 into cap wafer 10. In other words, the grinding continues until back surface 12 reaches the recessed areas. It should be noted that, after thinning, the back surface of cap wafer 10 is still denoted by reference number 12. By way of example, cap wafer 10 is ground to have a final thickness of approximately 125 µm.

It should be understood that the process of removing the silicon material between the partially etched cavities and back surface 12 of cap wafer 10 (FIG. 7) is not limited to grinding cap wafer 10 from back surface 12. In an alternative embodiment, cap wafer 10 is thinned by etching cap wafer 10 from back surface 12. In another alternative embodiment, the silicon between the recessed areas and back surface 12 (FIG. 7) is removed by cutting the silicon between the recessed areas and back surface 12 using a saw blade. The saw blade cuts into cap wafer 10 perpendicularly to back surface 12. It should be noted that cap wafer 10 has the same thickness before and after the saw blade cutting process. After the saw blade cutting process, the thickness of cap wafer 10 can be reduced, if desired, by a thinning process such as, for example, grinding, etching, etc.

The final thickness of the cap wafer 10 can be controlled by adjusting the initial thickness of cap wafer 10, the depth of the partially etched cavities, and the thinning process. To maintain the sturdiness of cap wafer 10 before cap wafer 10 is bonded to device wafer 30, cap wafer 10 preferably has a thick initial thickness such as, for example, ranging from approximately 200 µm to approximately 800 µm. To maintain easy access to the wire bonding pads, which are located on device wafer 30 outside the device packages, without increasing the die area, cap wafer 10 preferably have a thin final thickness such as, for example, ranging from approximately 100 µm to approximately 150 µm. The final thickness of cap wafer 10 can also be adjusted in correlation with the thickness of device wafer 30 to minimize the stress the cap wafer and device wafer package may induce on the semiconductor devices in the device packages.

By now it should be appreciated that a method for packaging semiconductor devices by bonding a cap wafer to a device wafer has been provided. In accordance with the present invention, partially etched cavities are formed on the cap wafer before the cap wafer is bonded to the device wafer. Therefore, the sturdiness of the cap wafer is maintained as the die density on the device wafer increases. After bonding the cap wafer to the device wafer, easy access to the wire bonding pads on the device wafer is achieved without increasing the die area by thinning the cap wafer. Further, the stress on the packaged device is minimized by optimizing the thickness ratio of the cap wafer to the device wafer.

While specific embodiments of the present invention have been shown and described, further modifications and improvements will occur to those skilled in the art. It is understood that the present invention is not limited to the particular forms shown and it is intended for the appended claims to cover all modifications of the invention which fall within the true spirit and scope of the invention. For example, the recessed areas and alignment holes on the cap wafer may be formed via mechanical drilling.

I claim:

1. A method for packaging semiconductor devices, comprising the steps of:

providing a device wafer having a major surface and a plurality of semiconductor devices formed thereon;

providing a cap wafer of a first thickness, the cap wafer having a front surface and a back surface;

forming a plurality of cavities in a first portion of the cap wafer, the plurality of cavities extending from the front surface into the cap wafer to a depth less than the first thickness of the cap wafer;

bonding the cap wafer to the device wafer while positioning the front surface of the cap wafer toward the major surface of the device wafer; and removing portions of the cap wafer between the plurality of cavities and the back surface of the cap wafer.

2. The method of claim 1, wherein said step of forming a plurality of cavities further includes forming an alignment hole in a second portion of the cap wafer, the alignment hole extending from the front surface to the back surface of the cap wafer.

3. The method of claim 2, wherein said step of forming a plurality of cavities further includes the steps of:

forming a first dielectric layer on the front surface of the cap wafer;

forming a second dielectric layer on the first dielectric layer;

forming openings in the second dielectric layer overlying the first portion and the second portion of the cap wafer;

removing the first dielectric layer that overlies the second portion of the cap wafer and is unprotected by the second dielectric layer;

etching the cap wafer that is unprotected by the first dielectric layer;

removing the first dielectric layer that overlies the first portion of the cap wafer and is unprotected by the second dielectric layer;

etching the cap wafer that is unprotected by the first dielectric layer to form the plurality of cavities in the first portion and the alignment hole in the second portion of the cap wafer; and removing the first dielectric layer and the second dielectric layer overlying the front surface of the cap wafer.

4. The method of claim 3, wherein said step of removing the first dielectric layer that overlies the second portion of the cap wafer and is unprotected by the second dielectric layer further includes the steps of:

forming a masking layer on the second dielectric layer and the first dielectric layer, the masking layer overlying the first portion of the cap wafer; and etching away the first dielectric layer that is unprotected by the masking layer and the second dielectric layer.

5. The method of claim 4, wherein said step of removing the first dielectric layer that overlies the first portion of the cap wafer and is unprotected by the second dielectric layer further includes the steps of:

removing the masking layer; and etching away the first dielectric layer that is unprotected by the second dielectric layer.

6. The method of claim 2, wherein said step of bonding the cap wafer to the device wafer further includes the steps of:

depositing a glass frit on the front surface of the cap wafer;

aligning the cap wafer with the device wafer using the alignment hole in the cap wafer;

positioning the front surface of the cap wafer toward the major surface of the device wafer so that the glass frit deposited on the front surface of the cap wafer contacts the major surface of the device wafer; and heating the glass frit until the glass frit bonds the cap wafer to the device wafer.

7. The method of claim 1, wherein said step of removing portions of the cap wafer between the plurality of cavities and the back surface of the cap wafer further includes the step of thinning the cap wafer from the back surface of the cap wafer until the cap wafer has a second thickness less than the depth of the plurality of cavities.

8. The method of claim 7, wherein said step of thinning the cap wafer further includes grinding the cap wafer from the back surface of the cap wafer.

9. The method of claim 7, wherein said step of thinning the cap wafer further includes etching the cap wafer from the back surface of the cap wafer.

10. The method of claim 1, wherein said step of removing portions of the cap wafer between the plurality of cavities and the back surface of the cap wafer further includes the step of cutting the portions of the cap wafer between the plurality of cavities and the back surface of the cap wafer using a saw blade.

11. A method for packaging semiconductor devices, comprising the steps of:

provided a device wafer having a plurality of semiconductor devices formed thereon, the plurality of semiconductor devices being arranged in a plurality of dies formed on a major surface of the device wafer;

providing a cap wafer having a front surface and a back surface;

forming a plurality of recessed areas from the front surface in a first portion of the cap wafer, the plurality of recessed areas being between the front surface and the back surface of the cap wafer, wherein the front surface in the first portion of the cap wafer outside the plurality of recessed areas forms a plurality of elevated areas;

forming an alignment hole in a second portion of the cap wafer, the alignment hole extending from the front surface to the back surface of the cap wafer;

aligning the cap wafer to the device wafer using the alignment hole so that an elevated area of the plurality of elevated areas overlies a die of the plurality of dies on the major surface of the device wafer;

hermetically sealing the die of the plurality of dies on the major surface of the device wafer via bonding the cap wafer to the device wafer; and removing portions of the cap wafer between the plurality of recessed areas and the back surface of the cap wafer.

12. The method of claim 11, wherein said steps of forming a plurality of recessed areas and forming an alignment hole further include the steps of:

forming an oxide layer on the front surface of the cap wafer;

forming a nitride layer on the oxide layer;

forming openings in the nitride layer overlying the first portion and the second portion of the cap wafer of the cap wafer;

removing the oxide layer that overlies the second portion of the cap wafer and is unprotected by the nitride layer;

etching the cap wafer that is unprotected by the oxide layer;

removing the oxide layer that overlies the first portion of the cap wafer and is unprotected by the nitride layer;

etching the cap wafer that is unprotected by the oxide layer to form the plurality of recessed areas in the first portion and the alignment hole in the second portion of the cap wafer; and removing the nitride layer and the oxide layer overlying the front surface of the cap wafer.

13. The method of claim 12, wherein said step of removing the oxide layer that overlies the second portion of the cap wafer and is unprotected by the nitride layer further includes the steps of:

forming a photoresist masking layer on the nitride layer and the oxide layer, the photoresist masking layer overlying the first portion of the cap wafer; and etching away the oxide layer that is unprotected by the photoresist masking layer and the nitride layer.

14. The method of claim 13, wherein said step of removing the oxide layer that overlies the first portion of the cap wafer and is unprotected by the nitride layer further includes the steps of:

removing the photoresist masking layer; and etching away the oxide layer that is unprotected by the nitride layer.

15. The method of claim 11, wherein said step of hermetically sealing the die of the plurality of dies on the major surface of the device wafer further includes the steps of:

screen printing a glass frit on the elevated area of the plurality of elevated areas on the cap wafer;

positioning the front surface of the cap wafer toward the major surface of the device wafer so that the glass frit screen printed on the elevated area of the plurality of elevated areas contacts the major surface of the device wafer around the die of the plurality of dies; and heating the glass frit until the glass frit bonds the cap wafer to the device wafer.

16. The method of claim 11, wherein said step of hermetically sealing the die of the plurality of dies on the major surface of the device wafer further includes the step of placing the cap wafer and the device wafer in a vacuum environment.

17. The method of claim 11, wherein said step of removing portions of the cap wafer between the plurality of recessed areas and the back surface of the cap wafer further includes the step of thinning the cap wafer from the back surface of the cap wafer until the back surface of the cap wafer reaches the plurality of recessed areas.

18. A method for packaging semiconductor devices, comprising the steps of:

providing a device wafer having a plurality of semiconductor devices formed thereon, the plurality of semiconductor devices being arranged in a plurality of dies formed on a major surface of the device wafer;

providing a cap wafer of a first thickness, the cap wafer having a front surface and a back surface;

forming a plurality of cavities in a first portion of the cap wafer, the plurality of cavities extending from the front surface into the cap wafer to a depth less than the first thickness, wherein the front surface in the first portion of the cap wafer outside the plurality of cavities forms a plurality of mesas;

forming an alignment hole in a second portion of the cap wafer, the alignment hole extending from the front surface to the back surface of the cap wafer;

depositing a glass frit on a mesa of the plurality of mesas of the cap wafer;

aligning the cap wafer to the device wafer using the alignment hole so that the mesa of the plurality of mesas overlies a die of the plurality of dies on the major surface of the device wafer;

placing the cap wafer and the device wafer in a reduced pressure environment;

hermetically sealing the die of the plurality of dies on the major surface of the device wafer by heating the glass frit until the glass frit bonds the cap wafer to the device wafer; and removing portions of the cap wafer between the plurality of cavities and the back surface of the cap wafer by thinning the cap wafer from the back surface of the cap wafer until the cap wafer has a second thickness less than the depth of the plurality of cavities.

19. The method of claim 18, wherein said steps of forming a plurality of cavities and forming an alignment hole further include the steps of:

forming an oxide layer on the front surface of the cap wafer;

forming a nitride layer on the oxide layer;

forming openings in the nitride layer overlying the first portion and the second portion of the cap wafer;

forming a photoresist masking layer on the nitride layer and the oxide layer, the photoresist masking layer overlying the first portion of the cap wafer;

etching away the oxide layer that is unprotected by the photoresist masking layer and the nitride layer;

removing the photoresist masking layer;

etching the cap wafer that is unprotected by the oxide layer;

etching away the oxide layer that is unprotected by the nitride layer;

etching the cap wafer that is unprotected by the oxide layer to form the plurality of cavities in the first portion and the alignment hole in the second portion of the cap wafer; and removing the nitride layer and the oxide layer overlying the front surface of the cap wafer.

20. The method of claim 18, wherein said step of removing portions of the cap wafer between the plurality of cavities and the back surface of the cap wafer further includes the step of grinding the cap wafer from the back surface of the cap wafer until the back surface of the cap wafer reaches the plurality of cavities.

* * * * *